US011631022B2

(12) United States Patent
Dalton et al.

(10) Patent No.: US 11,631,022 B2
(45) Date of Patent: Apr. 18, 2023

(54) FORECASTING SOIL AND GROUNDWATER CONTAMINATION MIGRATION

(71) Applicant: Azimuth1, LLC, McLean, VA (US)

(72) Inventors: Jason R. Dalton, Vienna, VA (US); Anna M. Harrington, Lynchburg, VA (US)

(73) Assignee: Daybreak, LLC, McLean, VA (US)

( * ) Notice: Subject to any disclaimer, the term of this patent is extended or adjusted under 35 U.S.C. 154(b) by 976 days.

(21) Appl. No.: 16/351,794

(22) Filed: Mar. 13, 2019

(65) Prior Publication Data

US 2019/0303785 A1    Oct. 3, 2019

Related U.S. Application Data

(60) Provisional application No. 62/649,682, filed on Mar. 29, 2018.

(51) Int. Cl.

| | |
|---|---|
| *G06F 30/27* | (2020.01) |
| *G06N 7/01* | (2023.01) |
| *G06T 11/20* | (2006.01) |
| *G06N 20/10* | (2019.01) |
| *G06T 17/05* | (2011.01) |
| *G06N 20/00* | (2019.01) |

(52) U.S. Cl.
CPC ............ *G06N 7/01* (2023.01); *G06F 30/27* (2020.01); *G06N 20/00* (2019.01); *G06N 20/10* (2019.01); *G06T 11/206* (2013.01); *G06T 17/05* (2013.01)

(58) Field of Classification Search
CPC ...... G06N 7/005; G06N 20/00; G06N 3/0454; G06N 7/01; G06N 20/10; G06T 11/206; G06T 17/05; G06F 30/27
See application file for complete search history.

(56) References Cited

U.S. PATENT DOCUMENTS

| | | | | |
|---|---|---|---|---|
| 9,672,644 B1 * | 6/2017 | Tulenko | ................ | G06T 11/206 |
| 2004/0243299 A1 * | 12/2004 | Scaer | ................... | G08G 1/202 |
| | | | | 701/522 |

(Continued)

FOREIGN PATENT DOCUMENTS

CN        106599396 A  *  4/2017  ............. G06F 17/50

OTHER PUBLICATIONS

U.S. Environmental Protection Agency, "The National LUST Cleanup Backlog: A Study of Opportunities", Sep. 2011.

(Continued)

*Primary Examiner* — Chuen-Meei Gan
(74) *Attorney, Agent, or Firm* — Williams Mullen; Thomas F. Bergert

(57) ABSTRACT

Soil and groundwater contamination migration are forecasted according to instructions stored in a memory and executable by a processor to facilitate prompt and accurate remediation efforts. In embodiments, an environmental machine learning model is employed, and analysis and determination of contaminant plume distances, sources and destinations are made. A database stores raw environmental site data, from which relevant data can be extracted for a site of interest, and the environmental machine learning model can be trained on the extracted relevant data to predict the spatial and cross-section probability distribution of a contaminant plume at the site of interest.

15 Claims, 12 Drawing Sheets

(56) References Cited

U.S. PATENT DOCUMENTS

| | | | | |
|---|---|---|---|---|
| 2010/0030475 A1* | 2/2010 | Sohl, III | ............. | G01N 1/4005 |
| | | | | 702/2 |
| 2011/0307221 A1* | 12/2011 | Higgins | .................. | G08B 5/36 |
| | | | | 702/45 |
| 2015/0073759 A1* | 3/2015 | Vepakomma | ........ | G06Q 50/265 |
| | | | | 703/6 |
| 2015/0309962 A1* | 10/2015 | Lichman | ................ | H04L 67/52 |
| | | | | 703/2 |
| 2017/0011299 A1* | 1/2017 | Ebert | ..................... | G06Q 10/06 |
| 2018/0373234 A1* | 12/2018 | Khalate | ................. | G06N 7/005 |

OTHER PUBLICATIONS

Grady, Stephen J., "A National Survey of Methyl tert-Butyl Ether and Other Volatile Organic Compounds in Drinking-Water Sources: Results of the Random Survey", U.S. Geological Survey, 2003.

* cited by examiner

70

80

FORECASTING SOIL AND GROUNDWATER CONTAMINATION MIGRATION

CROSS-REFERENCE TO RELATED APPLICATIONS

This application claims the benefit of U.S. Patent Application No. 62/649,682 filed on Mar. 29, 2018, the contents of which are incorporated by reference herein in their entirety.

STATEMENT REGARDING FEDERALLY SPONSORED RESEARCH OR DEVELOPMENT

The disclosed invention may be manufactured and used by or for the government of the United States of America for governmental purposes without the payment of any royalties thereon or therefor.

TECHNICAL FIELD

The present disclosure relates to soil and groundwater contamination, and more particularly to a system, device and method for measuring, monitoring and predicting soil and groundwater contamination migration.

BACKGROUND AND SUMMARY

Soil and groundwater contamination are major environmental and public safety hazards. Depending upon a multitude of factors, ground contaminants can migrate into bodies of water and other natural resources, potentially causing severe damage to those resources and surrounding environments, and further potentially causing negative health consequences for all varieties of living creatures.

The World Health Organization estimates that 23% of all deaths worldwide (12.6 million people) in 2012 were due to environmental causes. Exposure to environmental contamination serves as a significant barrier to achieving health and prosperity for society at large. There is a critical need for improvement of the environmental remediation process. Improvement in the site characterization and remediation process can decrease the time and money it takes to remediate environmental contamination, thereby reducing the societal risk of exposure and allowing for the allocation of resources previously consumed in lengthy remediation projects to address the backlog of contaminated sites. In the U.S. Environmental Protection Agency (EPA) report, "The National LUST Cleanup Backlog: A Study of Opportunities" (2011), the EPA noted that there are over 100,000 leaking underground storage tank (LUST) sites across the country in the national LUST backlog. This is the backlog from only one of many state and federal level programs to address contaminated sites across the country. As another example, in "A National Survey of Methyl tert-Butyl Ether and Other Volatile Organic Compounds in Drinking-Water Sources: Results of the Random Survey" (Grady, 2003), methyl tert-butyl ether (MTBE), a gasoline additive, was found in 8.7% of randomly selected community water systems in the United States.

Remediation efforts to clean up contaminated groundwater and soil require precise information as to the location, source and destination of the contaminants in order to maximize success. Traditional evaluations of groundwater and soil contamination have involved onsite assessments where the contamination is found, historical studies of the site where the contamination is found and onsite collections of soil samples. These bottom-up approaches can provide modest assistance in determining where clean-up and remediation efforts should be focused, and where economic responsibility should be placed, for example. Nevertheless, such approaches often yield inaccurate or inadequate results, ultimately resulting in wasted time, money and effort on remediation efforts that would ideally be better focused elsewhere.

Aspects of the present disclosure pertain to a system, device and computer-implemented method for measuring, monitoring and predicting soil and groundwater contamination migration wherein detailed soil, depth and groundwater profiles are discovered and aggregated, a geospatial learning model is employed, and analysis and determination of contaminant plume locations, sources and destinations are made to facilitate prompt and accurate remediation efforts. In this way and as described herein, the present disclosure reveals a technical improvement to computer-generated learning models associated with contamination forecasting and associated remediation. Aspects of the present disclosure reveal embodiments wherein a processor and a memory storing instructions executable by the processor receive raw environmental site data, extract relevant data from the received raw environmental site data for a site of interest, and train an environmental machine learning model on the extracted relevant data to predict the spatial and cross-section probability distribution of a contaminant plume at the site of interest.

By changing the way contaminated sites are characterized and evaluated, among other things, the present disclosure provides remediation specialists with likely contaminant behavior and extent at contamination sites.

In various aspects, embodiments of the present disclosure show the most likely extent of underground contamination using a machine learning model synthesizing many prior spills. Among other things, such output provides evidence for an environmental investigation, emphasizing the common and most likely results consistent with sites that have similar soil, groundwater, climate, and topographic characteristics. Embodiments of the present disclosure are suitable for initial site characterization, verification, investigation of unknown source zone, and probability estimates of source zone contamination range estimates, which can complement and provide context for environmental site assessment investigations.

DETAILED DESCRIPTION OF EMBODIMENTS

Figure 1:
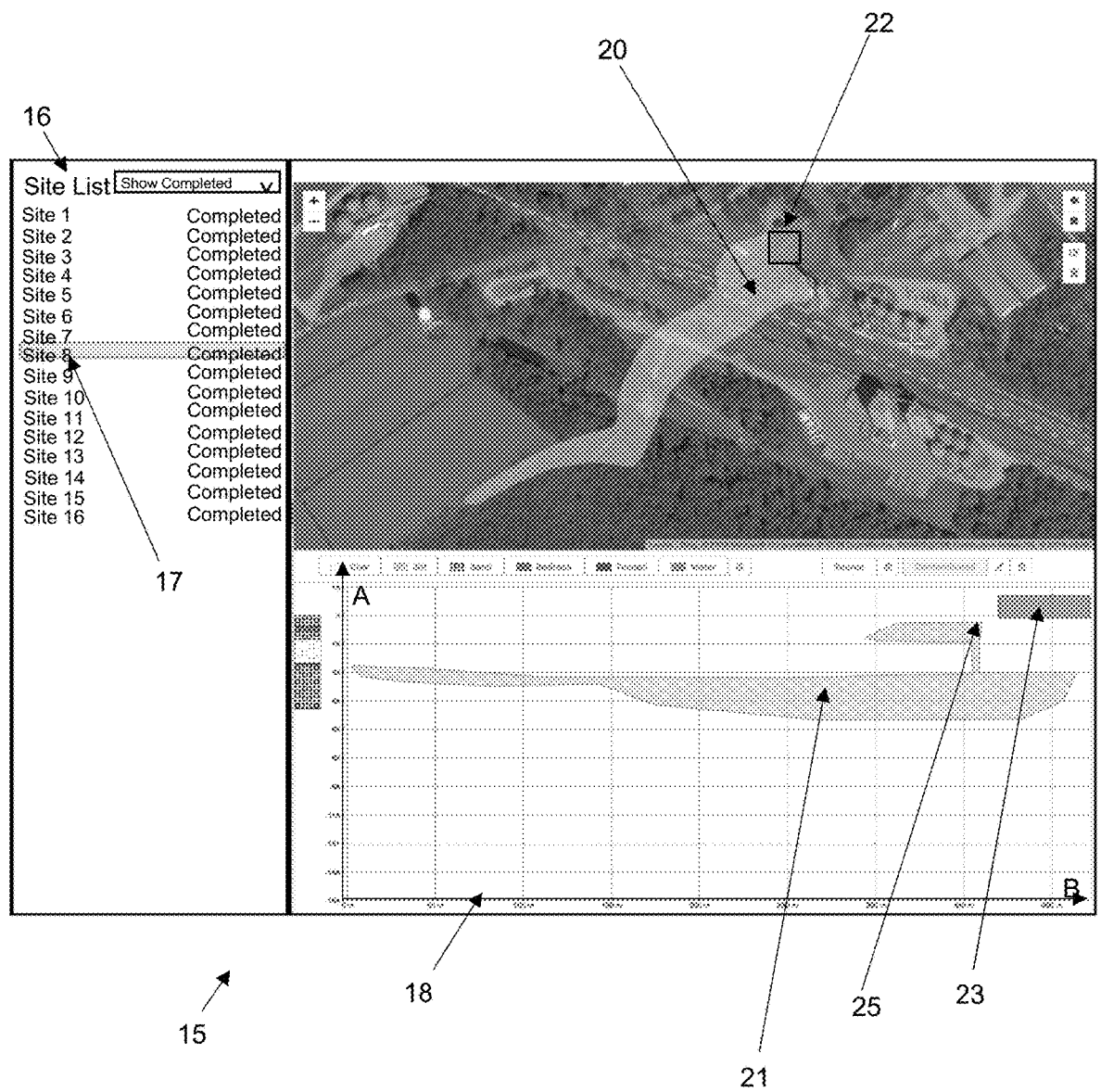
FIG. 1 is an example screen shot of a visual interface associated with the present disclosure.

The presently disclosed subject matter now will be described more fully hereinafter with reference to the accompanying drawings, in which some, but not all embodiments of the presently disclosed subject matter are shown. Like numbers refer to like elements throughout. The presently disclosed subject matter may be embodied in many different forms and should not be construed as limited to the embodiments set forth herein; rather, these embodiments are provided so that this disclosure will satisfy applicable legal requirements. Indeed, many modifications and other embodiments of the presently disclosed subject matter set forth herein will come to mind to one skilled in the art to which the presently disclosed subject matter pertains having the benefit of the teachings presented in the foregoing descriptions and the associated drawings. Therefore, it is to be understood that the presently disclosed subject matter is not to be limited to the specific embodiments disclosed and that modifications and other embodiments are intended to be included within the scope of the appended claims.

Example embodiments such as disclosed herein can incorporate a system having a processor and an associated memory storing instructions that, when executed by the processor, cause the processor to perform operations as described herein. The system can be embodied as a server, for example. It will be appreciated that reference to "a", "an" or other indefinite article in the present disclosure encompasses one or more than one of the described element. Thus, for example, reference to a processor encompasses one or more processors, reference to a memory encompasses one or more memories, reference to a plume encompasses one or more plumes and so forth.

In the present disclosure, a "computing device" can refer to one or more software modules that handle data, formulate models and rules, and perform data matching, training and cross-validation by using appropriate logic and criteria, including but not limited to software for the prediction of the extent and cross-section of a contaminant plume. In various embodiments, the computing device can be implemented as part of a server, a user computing device, a user communications device and other forms of computing devices. Examples of suitable implementations of the computing device include servers, authorized user computing devices, smartphones, desktop computers, laptop computers, tablet computers, PDAs and other types of processor-controlled devices that receive, process, or transmit digital data. External data sources can be employed and can include, for example, a single database, multiple databases, or a virtual database, including data from multiple sources, for example, servers accessible via the Internet. It will be appreciated that data described in this disclosure as being stored in the databases can also be stored or maintained in non-transitory memory and accessed among subroutines, functions, modules, objects, program products, or processes, for example, according to objects or variables of such subroutines, functions, modules, objects, program products or processes.

The EPA and individual state governments are known sources of soil, depth and groundwater profile data. Prevalent soil and groundwater contaminants can come from many sources, each with differing characteristics of flow when in the soil and groundwater environment. Embodiments of the present disclosure can, in various embodiments, partition a catalog of data into categories according to the eight physiographic provinces and twenty-four ecological zones, or eco-regions that make up the United States, for example. Eco-regions are areas where ecosystems are generally similar, such as terrestrial zones that contain similar climate, flora, and fauna.

In order to more completely understand the potential migration of a given contaminant, it is necessary to understand the three-dimensional extent of the contaminant's presence in the environment. Unfortunately, archived summary data generally does not contain enough information to characterize the three-dimensional extent of a contaminant's presence. In various embodiments according to the present disclosure, raw data from various sources can be augmented with tags and annotations containing geologic and three-dimensional plume information. Such information can be added manually or automatically, using data obtained from other sources, such as geologic profiles, depth to water measurements, records of decision, contaminant plume maps and transect views, for example.

In accordance with aspects of the present disclosure, the raw environmental data can be adapted into a feature set that one or more machine learning algorithms or models according to the present disclosure can learn and generate predictions from. In one aspect, an internal GIS data tool is used to characterize the contaminant migration, the groundwater gradient, soil conditions, and depth to groundwater for each site in the collected raw data. An example screen shot of a visual interface 15 for an internal GIS data tool that may be used, for example, by an internal technician, is depicted in FIG. 1, showing a site list 16, a selected site 17 and a graph 18 with ground depth along axis A and lateral distance along axis B. As shown therein, a graphical overlay 20 on a photographic image and a graphical display 21 of a contaminant plume is shown, along with a graphical overlay 22 on a photographic image and a graphical display 23 of a contaminant source zone. As can be seen at point 25, the contaminant plume 21 is very close to the contaminant source zone 23 and within a short geographic distance. In various embodiments, the three-dimensional geometry of contaminant plumes can be employed by the machine learning model according to the present disclosure.

Figure 2:
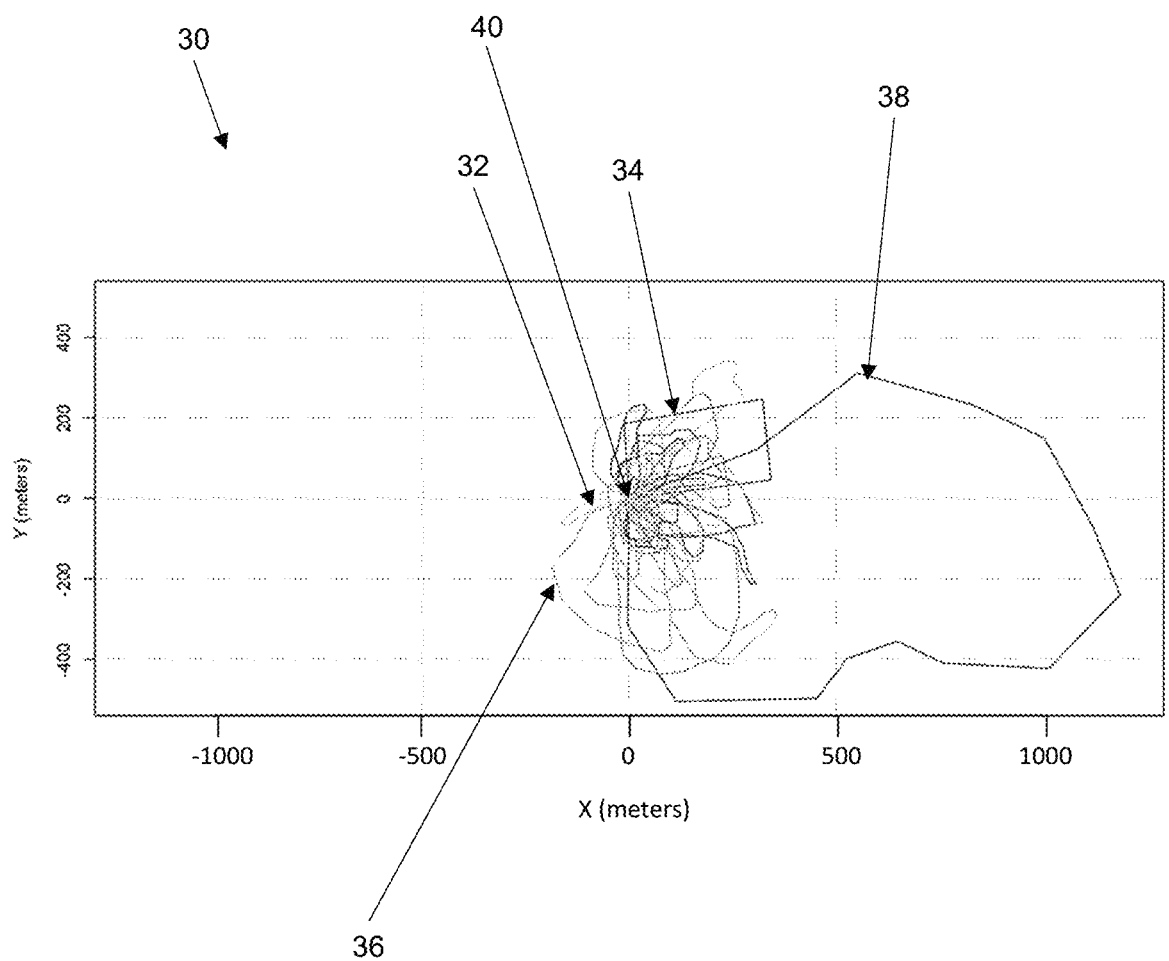
FIGS. 2 through 3 are example diagrams representing contamination plumes in accordance with aspects of the present disclosure.

It will be appreciated that various site data associated with past contaminated sites can be filtered based on geographic and geologic similarities to a site being evaluated. For example, relevant data may include only those that match the contaminant type, physiographic region, and eco-region of the current site being evaluated. The collected raw data, as augmented, can be deployed according to the present disclosure for training a predictive/machine learning model. As part of leveraging these data through data registration steps and training the machine learning model, geometric representations of plumes at each site (e.g., polygons) can be shifted into a common frame of reference by placing each contamination source zone at the origin. At the time of data capture, all delineated plumes can be geospatially referenced so that real world geometric measurements can be made. In various embodiments, translation is performed from geospatial coordinates to a local metric coordinate measurement system called Uniform Transverse Mercator, or UTM coordinates. These coordinates are measured in meters for a flat projected coordinate plane. As shown in the diagram 30 in FIG. 2, for example, multiple polygons 32, 34, 36 and 38, for example, are represented as shifted plumes with the contamination source zone 40 as the origin.

Figure 3:
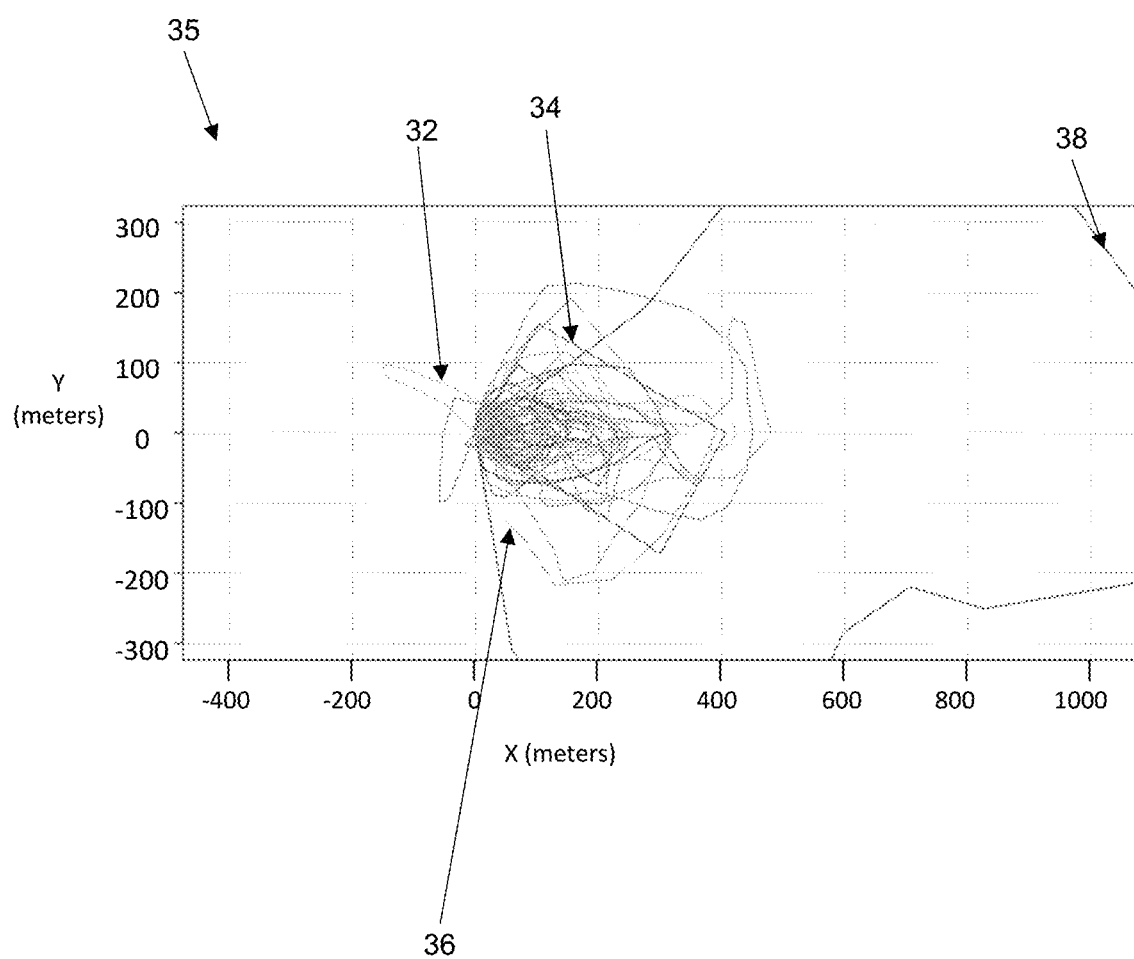

Next, each plume geometry is oriented so that the groundwater gradient is oriented in the positive X axis direction. The extracted groundwater elevation gradient shows the predominant path that groundwater will flow, taking contaminants with it. Therefore, the groundwater gradient direction is a consistent direction reference to translate the plume geometry into comparable units. In diagram 35 in FIG. 3, the plume geometries 32, 34, 36 and 38 (and the remaining unlabeled plume geometries) are shown shifted to common origin and orientation.

After shifting, the plume geometries are then imported into the machine learning model to create a forecast for future plumes. In various embodiments, the specific model used is a geospatial kernel density estimation that produces a probability estimate for the extent and dispersion of future plumes. The algorithm implementation can use kernel density estimation in three dimensions with partitioning along the dimensions of contaminant type (e.g., LNAPL (light non-aqueous phase liquids) or DNAPL (dense non-aqueous phase liquids)), eco-region, and physiographic province, for example. In variations, deep learning techniques such as convolutional neural networks (CNNs) can be applied to the data array. CNNs typically require very large amounts of data to begin performing better than other methods, so such approach assists with evaluating large data volume. In other variations, the partitioning of the data by contaminant, eco-region, and physiographic province is replaced by using those characteristics directly as model inputs. If the behaviors of LNAPL and DNAPL migration are sufficiently correlated with the soil characteristics, temperature, and weather, such variables can be employed according to the present disclosure for added predictive power.

Embodiments of the environmental machine learning model as disclosed herein establish a statistical correlation between output variables and predictor variables. In various embodiments, the model according to the present disclosure learns the likely plume formation without being overfit or biased by any one input plume. By removing this bias and learning from many contaminated sites, the model of the present disclosure can be used to show how discovered contaminations would tend to behave. In various embodiments, the predictive correlation can be generated by a computing device by applying a machine learning model to correlate data acquired from environmental data sources with a plurality of properties of a contaminant plume.

In various embodiments, there are at least three components to the analysis: the distribution of the downgradient distances analysis, the unknown contaminant destination model, and the unknown contaminant origin model.

Figure 7:
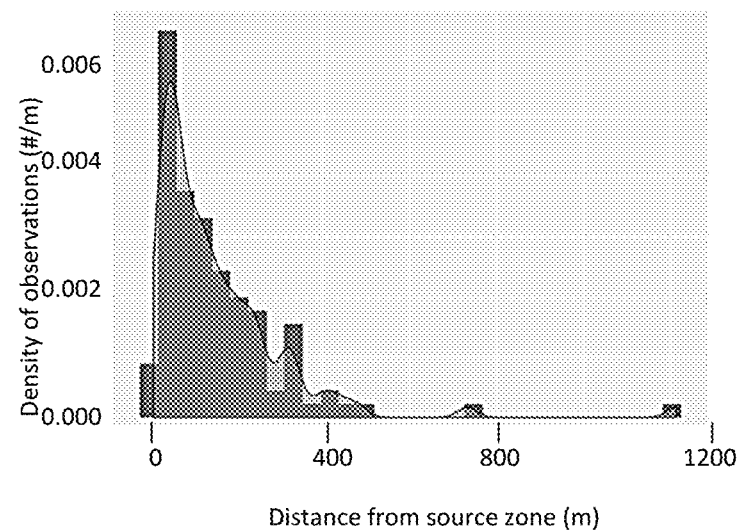
FIG. 7 is a graph showing an example empirical probability distribution in accordance with aspects of the present disclosure.

Downgradient distances refer to how far a contaminant plume flows in the down hydraulic gradient (i.e., pressure-influenced) direction. From a known source, the distribution of previous sites' contamination plumes is calculated to give a probability estimate of the contaminant plume extent at the subject site. For example, if the contaminant type is benzene, and there are eighty stored instances of benzene contaminant leaks at different sites, the system of the present disclosure can calculate an empirical probability distribution for the distance down the hydraulic gradient for all related contaminated sites, providing a lookup table for the probability that a contaminant source and furthest measurable extent would be separated by a given distance. It will be appreciated that related contaminant sites may not necessarily include all eighty sites having a benzene contaminant leak. Rather, sites that have similar soil, groundwater, climate, and topographic characteristics can be considered along with, or to the exclusion of, the contaminant type, depending upon the determined similarities with the site of interest and any other factors deemed important to the analysis. An example empirical probability distribution is provided in FIG. 7, described in more detail below.

Figure 4:
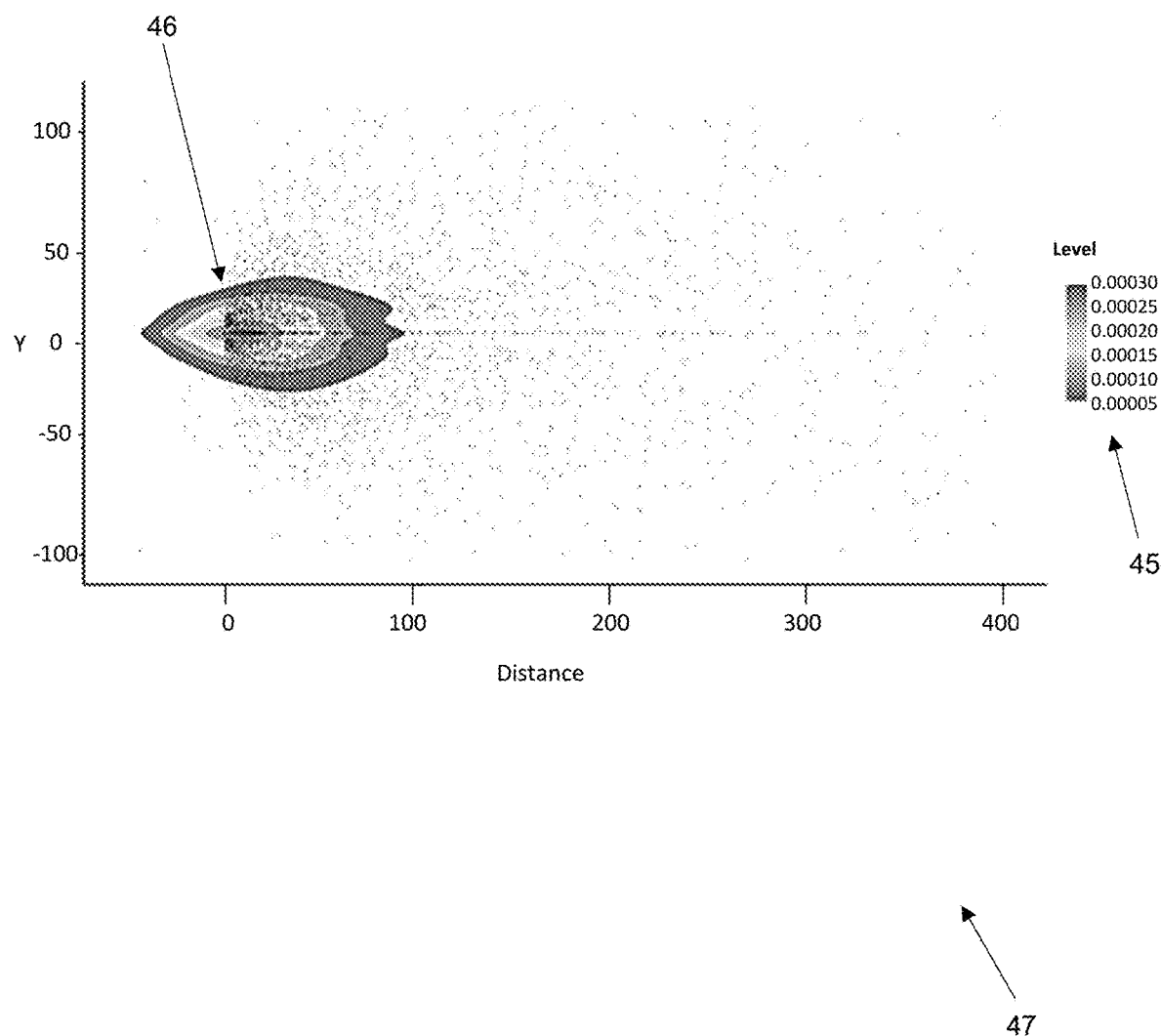
FIGS. 4 and 5 are graphs of probability density estimates in accordance with aspects of the present disclosure.

From the model in accordance with aspects described herein, dispersion and stratigraphic depth of the contaminated area can be forecasted. This forecast can be used in two different modes—unknown origin, and unknown destination. The unknown destination model assumes a known source zone and estimates the extent of the resulting contaminated area. The unknown destination model shows the highest probability estimates for the location of the farthest detectable contaminated area down the hydraulic gradient from the contamination source zone. An example graphical representation of the unknown destination model for the subject site, assuming a linear hydraulic gradient, is shown in graphic 47 of FIG. 4, where probability distribution estimate 45 provides the probability density estimate for the destination zone location of the plume 46. The dispersion and gradient flow results give a representation of the ranges of transport of contaminants and the associated prior probabilities.

Figure 5:
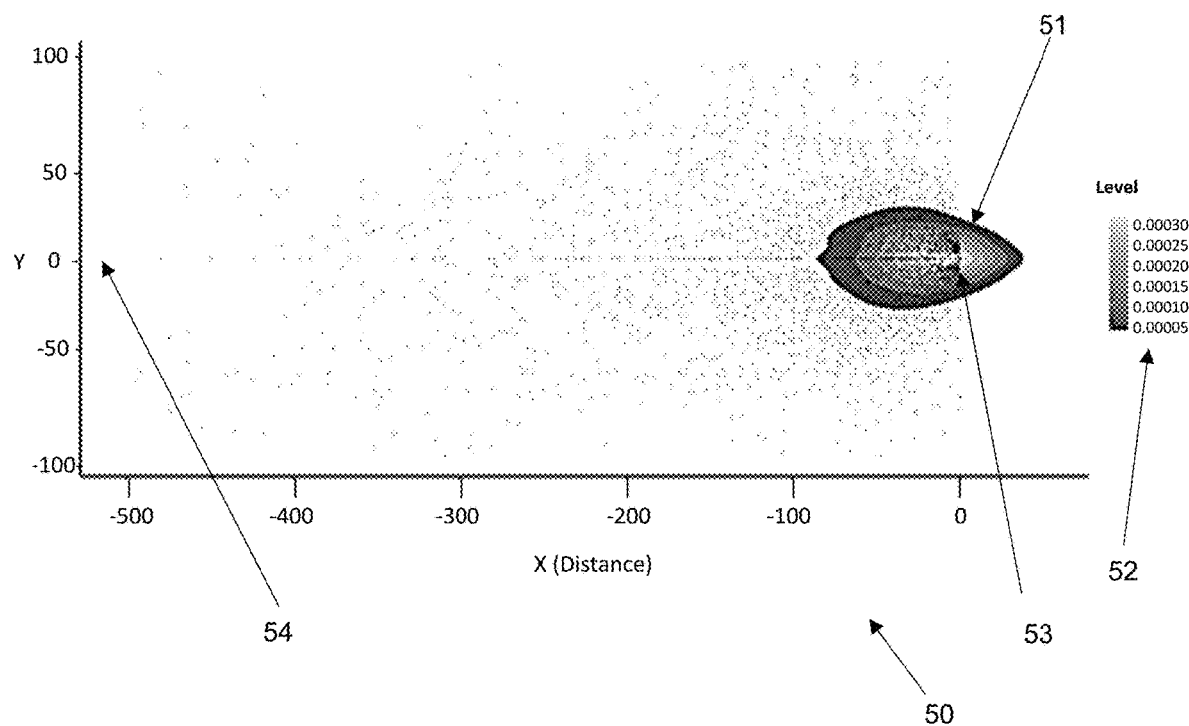

Another mode of operation is for situations in which there is detected contamination, but the source is unknown. This often occurs when one property is contaminated, while a neighboring property may be the source of the contamination. This unknown origin model looks up hydraulic gradient from the detected contamination to find probabilities for the possible candidate source zones. An example graphical representation of the unknown origin model is shown in the graphic 50 in FIG. 5, where table 52 provides the probability density estimate for the source zone location of the plume 51. For the unknown contaminant origin model, the origin 53 is trained over the reported contaminant detection and as you move along the linear hydraulic gradient 54 (represented as y=0), the plume 51 captures zones of probability for source zone location(s) with corresponding probability density estimate values as listed in table 52.

Figure 6:
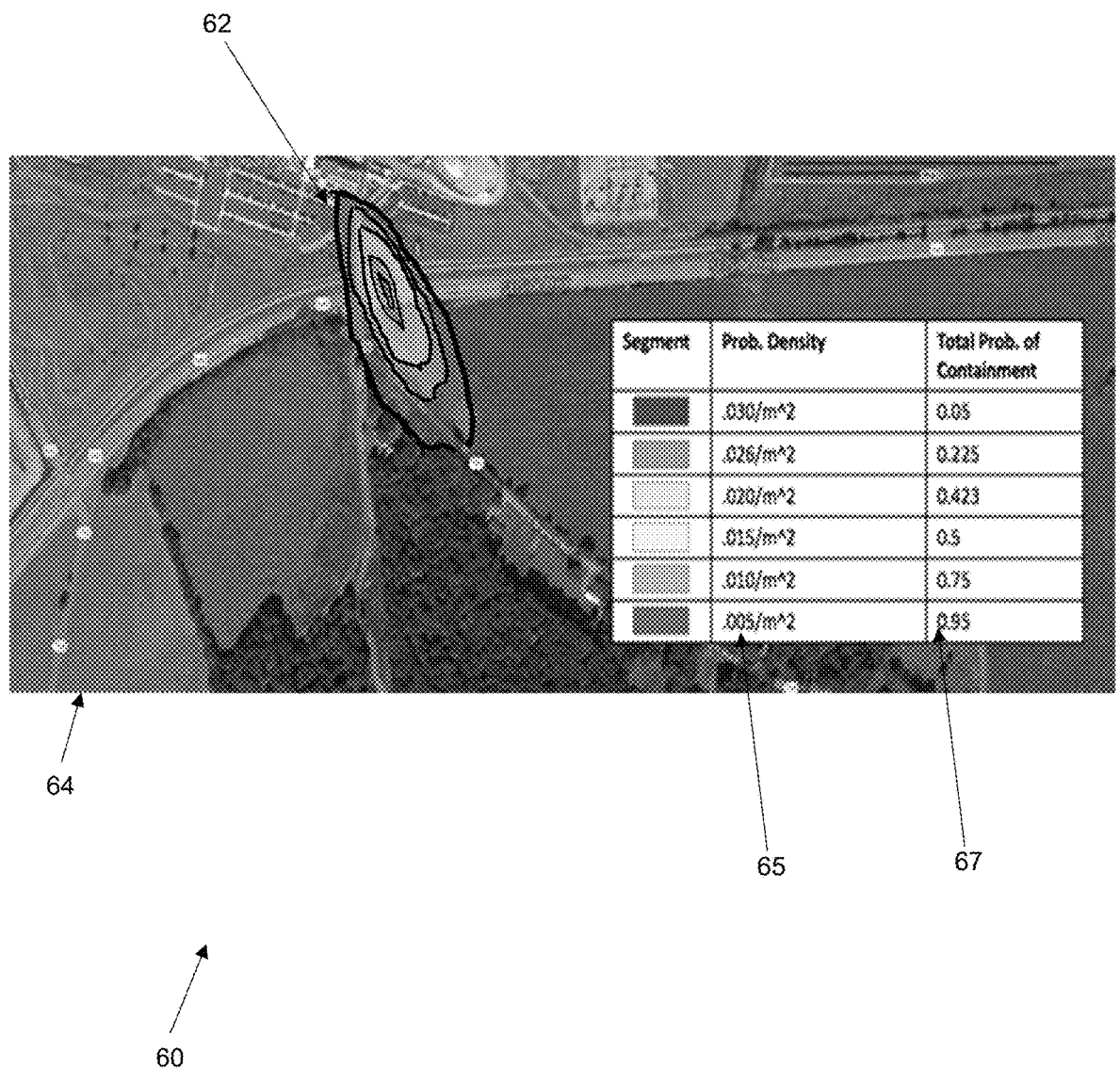
FIG. 6 is an example graphic in a generated report showing model output in accordance with aspects of the present disclosure.

As a further step according to the present disclosure, the forecasted model output is then projected back into the real-world orientation and coordinates of a target site in a geographic information system (GIS). An exemplary GIS system that can be employed is an open source system called QGIS. The orientation and flow of the groundwater is used to project the unknown destination model down hydraulic gradient from a source, or the unknown source model up hydraulic gradient from a detection. As shown in the screen display 60 of FIG. 6, the projected plume 62 is presented on a map display 64 in the real-world orientation and coordinates, with probability density estimates 65 and total probability of a contaminant source being contained within a given boundary 67 represented in table form. Other forms of displaying probability density estimates and probabilities of contamination containment can be provided.

Next, the translated model can be used to calculate the probability that the contaminant source is contained in specified regions, grid cells, or property boundaries. For instance, as shown in the chart 70 of FIG. 7, probabilities of a contaminant being within a certain range of the source can be represented graphically. Such probabilities can also be represented in table form, as shown in Table 1 below.

TABLE 1

| Candidate Source Distance (meters) | Probability (%) |
|---|---|
| 0-50 | 23.853 |
| 51-100 | 20.183 |
| 101-150 | 18.349 |
| 151-200 | 11.927 |
| 201-250 | 8.257 |
| 251-300 | 3.670 |
| 301-350 | 6.422 |
| 351-400 | 1.835 |
| 401-450 | 1.835 |
| 451-500 | 1.835 |

Such graphics can be useful by, for example, delineating a total probability of containment for successively larger areas, trading off the likelihood that a remediation program is successful with the total cost of that program, presuming larger areas require larger budgets to remediate.

Figure 8:
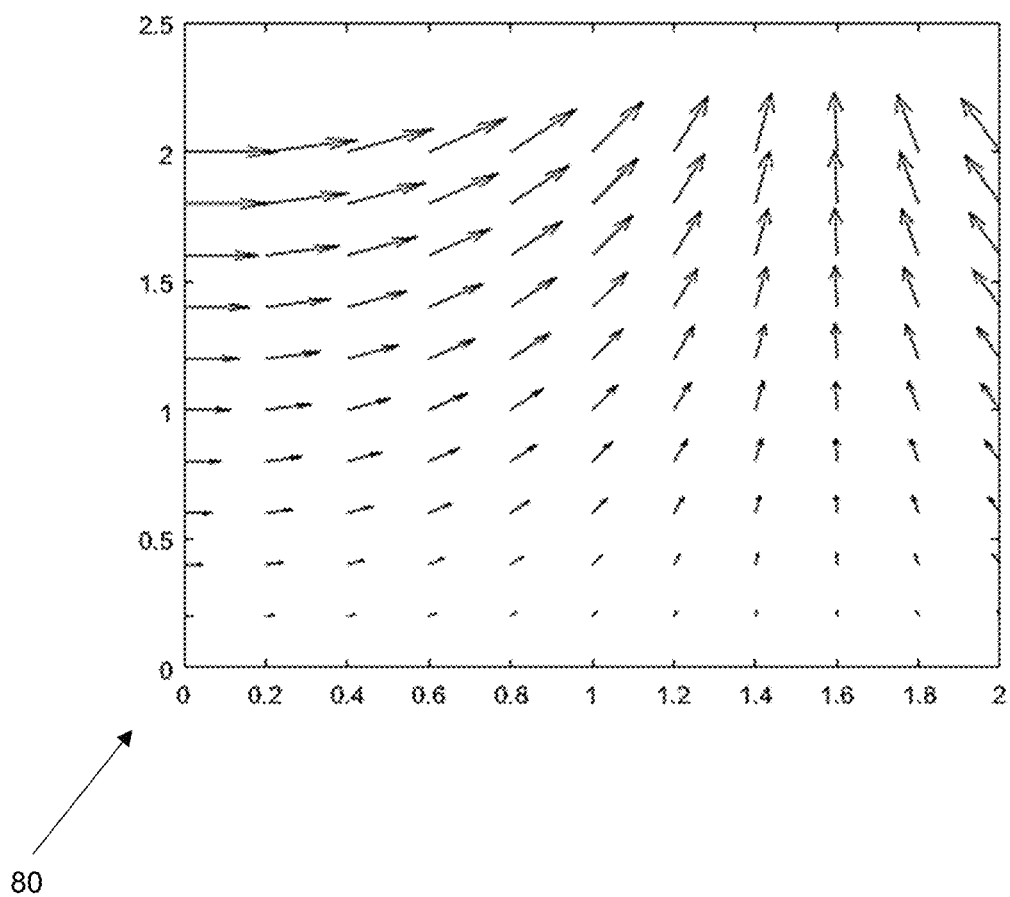
FIG. 8 shows a graphical display of a groundwater gradient path in accordance with aspects of the present disclosure.
Figure 9:
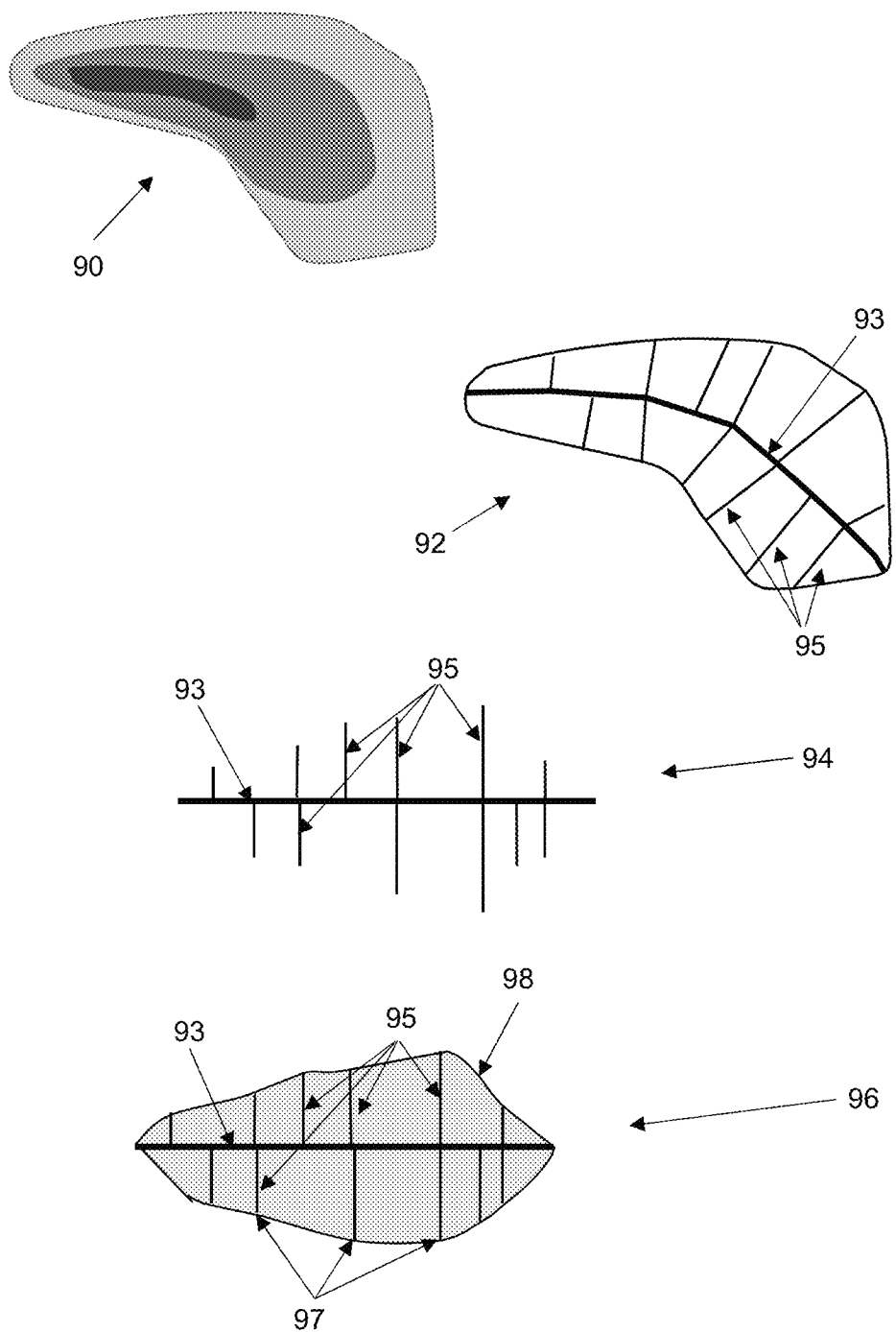
FIG. 9 shows an exemplary process of straightening the geometry of a contaminant plume into an abstract linear groundwater gradient in accordance with aspects of the present disclosure.

In various embodiments, the groundwater gradient can be assumed to be a single gradient direction. In other embodiments, the groundwater gradient can be modeled to turn along a curved path from the source zone, but still always in a downgradient direction. An illustration of a typical groundwater gradient path is shown at 80 in FIG. 8. To accommodate this curved path, the presently disclosed system and method use a technique to co-register the dispersion plumes by straightening the geometry into an abstract linear groundwater gradient. The process of straightening relies on finding the medial axis of a polygon geometry. Exemplary steps to register the model to the groundwater gradient are shown in FIG. 9. Step diagram 90 shows the original plume, and step diagram 92 shows the medial axis 93 with plume widths 95. Step diagram 94 shows the medial axis 93 straightened horizontally with the plume widths 95 presented vertically. Step diagram 96 shows the projected plume 98 by connecting the tops 97 of the plume widths 95.

Figure 10:
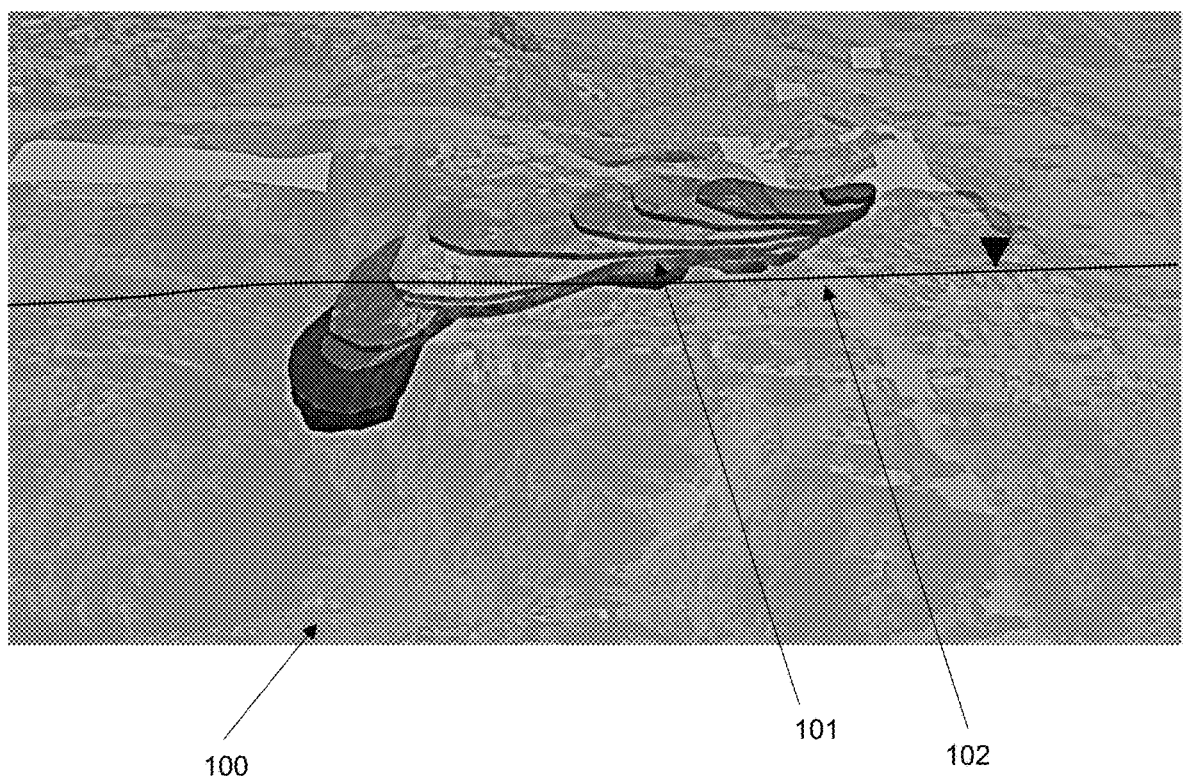
FIG. 10 shows an exemplary three-dimensional graphic showing plume concentrations and groundwater surface details associated with a contaminated site in accordance with aspects of the present disclosure.

In various embodiments, the three-dimensional geometry can be constructed automatically from the model output, merging the two-dimensional plan view output and the two-dimensional cross-sectional output into a combined three-dimensional output. This model can be converted to a web viewable three-dimensional model using a suitable library, for example, and combined with site specific elevation, aerial imagery, and infrastructure to place the model into the context of the site. FIG. 10 shows an exemplary three-dimensional graphic 100 of a contaminated site showing plume concentrations (e.g., 101) and groundwater surface (e.g., 102).

Figure 11:
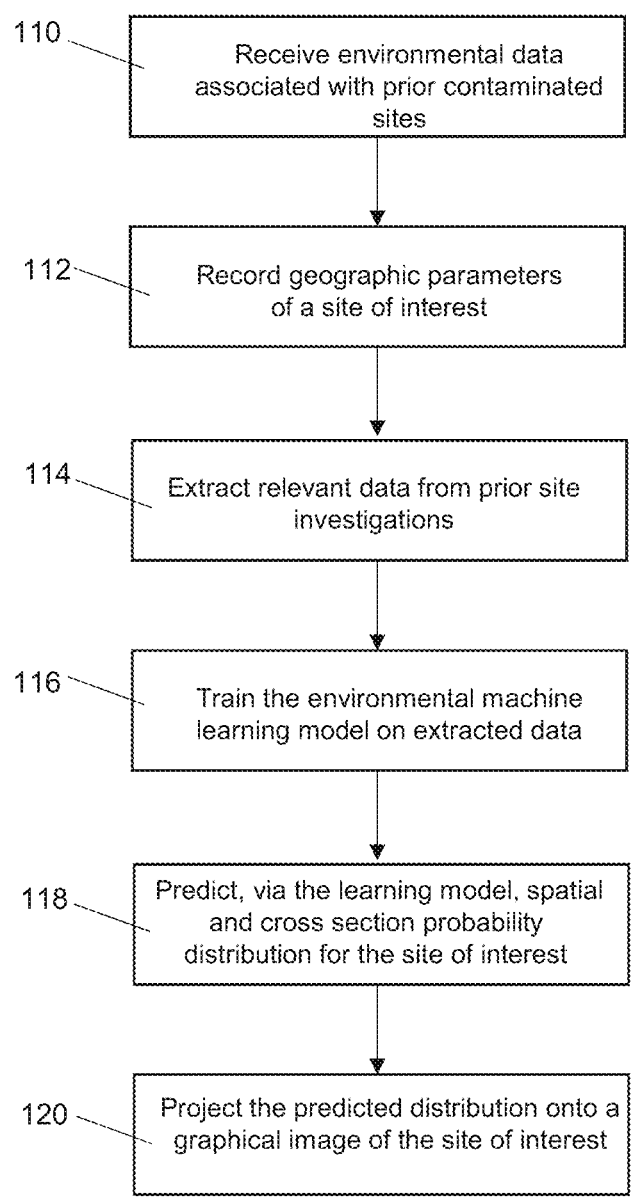
FIG. 11 is a flow diagram illustrating modeling of contaminant plumes in accordance with embodiments of the present disclosure.

FIG. 11 shows an exemplary process for accurately modeling contaminant plumes in accordance with aspects of the present disclosure. The process starts in step 110 with cataloging prior contaminated sites. It will be appreciated that significant numbers of contaminated sites can be cataloged in order to provide a robust data set. Further, the raw data from various sources can be augmented with tags and annotations containing geologic and three-dimensional plume information. Such information can be added manually or automatically, using data obtained from other sources, such as geologic profiles, depth to water measurements, records of decision, contaminant plume maps and transect views, for example. At step 112, the geographic parameters of a new site of interest (e.g., a newly discovered site where contamination exists) are recorded, such as the physiographic region, the eco-region and other parameters, for example. At step 114, relevant data is extracted from prior site investigations. Such relevant data can include, for example, three-dimensional volume data of prior contamination plumes. As described elsewhere herein, upon extracting data from the system database, all coordinates of historical plumes can be translated to a common contaminant origin, and all plumes can be rotated to a common orientation. Such steps are not shown in FIG. 11, but can be taken in accordance with aspects of the present disclosure. At step 116, a machine learning model is trained based on the imported plume geometries. At step 118, the machine learning model predicts spatial and cross section probability distribution for the new site of interest. At step 120, the predicted probability distribution, i.e., the output model, is projected onto a graphical image of the site of interest. In various embodiments, the predicted model is projected with orientation and curvature to match the local groundwater flow path. The calculation of the probabilities of contamination can also be represented as described elsewhere herein. Optionally, the two-dimensional output models can be merged into a three-dimensional representation for one form of many types of output. Other output can include reports, GIS files and graphics, for example. The predicted models, reports, graphical images, files and other output are exemplary practical applications of the system, device and method associated with the present disclosure.

In step 114, it will be appreciated that in data matching for the site in question, the system filters out (for inclusion in the analysis) the data that is relevant. Relevant data can include those that match the contaminant type, physiographic region, and eco-region of the site of interest, for example. The contaminant type matches the broad categories of light non-aqueous phase liquids (LNAPL), dense non-aqueous phase liquids (DNAPL) and heavy metals. Examples of LNAPL are gasoline, benzene, toluene, xylene, and other hydrocarbons. Examples of DNAPL are chlorinated solvents, coal tar, and some heavy crude oils. Light and dense in this case refer to density compared to water, which drives the behavior of the contaminant when it interacts with groundwater. The physiographic region describes the geomorphology of segmented areas of the globe. These regions have been characterized and mapped across the U.S., for example, permitting the cataloging of the physiographic region for each contaminated site. Within a physiographic region, the soil layers, topography, and groundwater properties are largely consistent, allowing the learning model in accordance with the present disclosure to make inferences about the soil types and movement of contaminants within the same region. The eco-region is a designation of terrestrial zones that contain similar climate, flora, and fauna. For modeling purposes in accordance with the present disclosure, sites within the same eco-region encounter similar temperature ranges, rainfall, microbes, and soil chemistry, making modeling inference within each region more powerful than across regions. For this reason, collected data is partitioned, in various embodiments, into subsets of contaminant type, eco-region, and physiographic region for site analysis.

Figure 12:
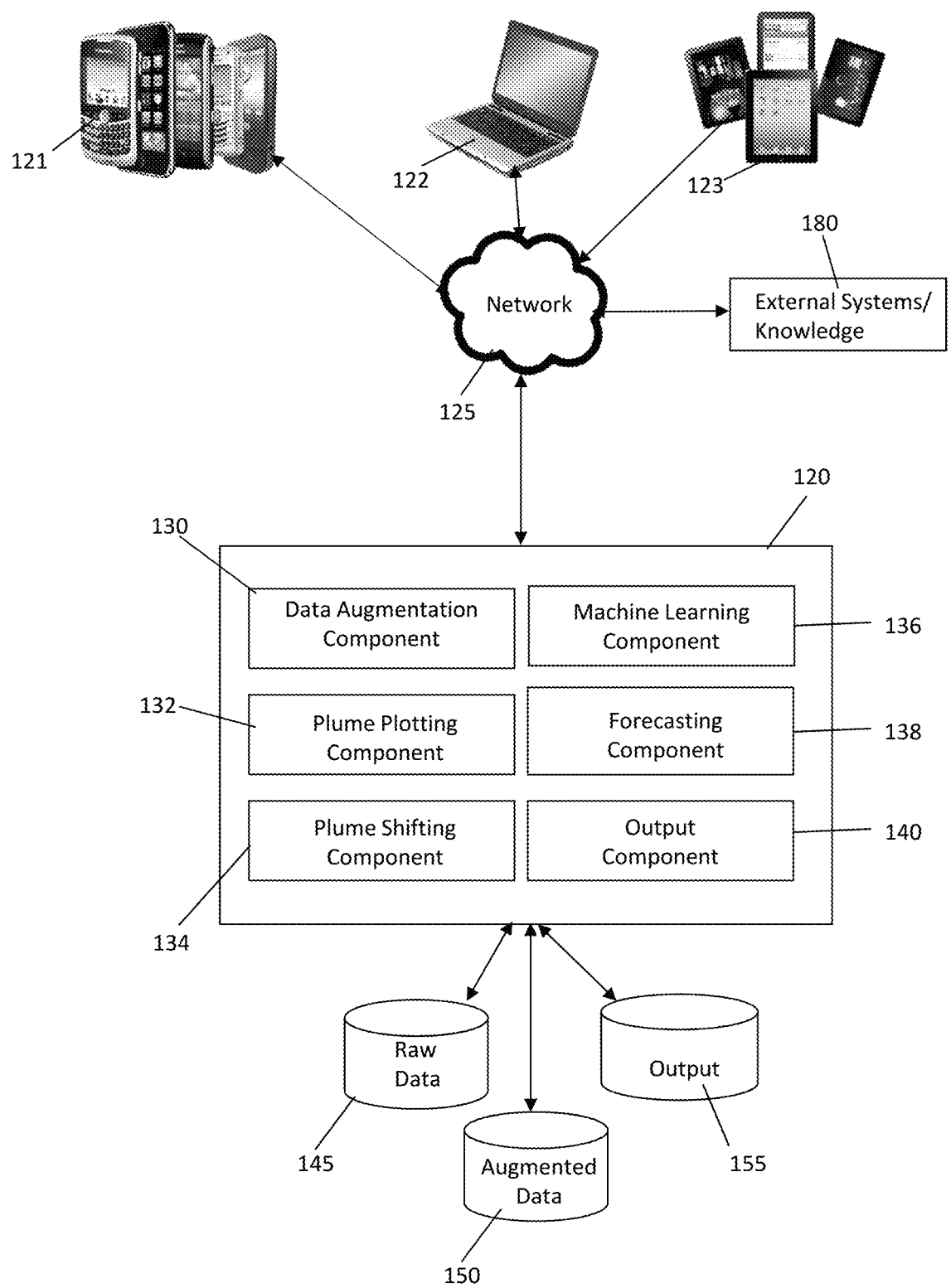
FIG. 12 is an exemplary system architecture in accordance with the present disclosure.

In accordance with the present disclosure, FIG. 12 shows an exemplary system 120 having various components that facilitate measuring, monitoring, and forecasting soil and groundwater contamination migration. Various users of the presently disclosed system can access and implement functions provided by the system 120 using devices, such as mobile communications devices 121, laptop and other similar computing devices 122, and tablet computing devices 123, for example. While such devices 121, 122 and 123 are shown in FIG. 1, it will be appreciated that desktop computers and other computing devices not shown could potentially be employed with the system disclosed herein.

The users can employ devices to access and implement functions provided by the system of the present disclosure using network 125, which can be a public network such as the Internet, for example, or a non-public network.

In various aspects, the system 120 disclosed herein includes a data augmentation component 130, a plume plotting component 132, a plume shifting component 134, a machine learning component 136, a forecasting component 138, and an output component 140. It will be appreciated that the components described need not be physically or electronically partitioned as standalone components. For example, all components can be provided as part of a single computer software program.

The data augmentation component 130 includes programming for retrieving raw data (e.g., from database 145), and supplementing the data with detailed soil, depth, and groundwater profiles, including geologic and three-dimensional plume data, for example.

To train the machine learning model, such as embodied in the machine learning component 136, forecasting component 138 and output component 140, for example, detailed data is obtained on the three-dimensional underground plume dimensions, the contaminant type, soil conditions, and groundwater elevation gradient, for example. The supplemented and/or augmented data is stored in database 150. The plume plotting component 132 includes programming for, among other things, plotting plume information from the augmented data in graphical form. The plume shifting component 134 employs programming for shifting the plume geometries to common origin and orientation. The machine learning component 136 models the plume geometries to inform the forecasting component 138, which can predict likely locations for a source and/or destination of contaminants. The output component 140 can generate graphs, three-dimensional displays, reports and other forms of output as desired by the user.

In various embodiments, the presently disclosed system and method can be implemented as a software-as-a-service offering. For instance, a user interface is provided for entering the model's initial parameters, such as contaminant type, whether the site is the source or is being contaminated from elsewhere, and the coordinates of the specific point in question. Next, the extraction of data matching the source data parameters is automatically conducted, using data that matches the eco-region and physiographic region, for example. Next, the data is compiled in a resulting predictive model, and model outputs are exported onto the input site shown in the user interface, with results adjusted as appropriate to fit the groundwater gradient flow path. The three-dimensional output can be displayed in a web accessible window along with the site terrain model, groundwater, and aerial imagery, for example. In this way, field geologists and project managers can input the parameters of their contaminated release, and get an immediate view of the likely extent and depth profile of their site contaminant. Having a mobile app allows field scientists to take this reference and modeling tool with them into the field without need for larger computing power.

In various embodiments, the components, sub-components and/or modules associated with the present disclosure can be implemented using object oriented languages such as C++ or Java using well defined software interfaces such that the implementation of any component can replaced by another with equivalent functionality without affecting the overall functionality of the workbench. It will be appreciated that access can be provided over a public or private network 125, including the Internet, in various embodiments of the present invention. Further, external systems 180 (see FIG. 12) can be accessed via the present system for supplemental information such as, for example, raw data.

Through all the above, and as described herein, the presently disclosed system, device and method provide a technical solution to the challenge of developing and using computer-generated learning models for contamination forecasting and associated remediation.

Unless otherwise stated, devices or components of the present disclosure that are in communication with each other do not need to be in continuous communication with each other. Further, devices or components in communication with other devices or components can communicate directly or indirectly through one or more intermediate devices, components or other intermediaries. Further, descriptions of embodiments of the present disclosure herein wherein several devices and/or components are described as being in communication with one another does not imply that all such components are required, or that each of the disclosed components must communicate with every other component. In addition, while algorithms, process steps and/or method steps may be described in a sequential order, such approaches can be configured to work in different orders. In other words, any ordering of steps described herein does not, standing alone, dictate that the steps be performed in that order. The steps associated with methods and/or processes as described herein can be performed in any order practical. Additionally, some steps can be performed simultaneously or substantially simultaneously despite being described or implied as occurring non-simultaneously.

It will be appreciated that algorithms, method steps and process steps described herein can be implemented by appropriately programmed computers and computing devices, for example. In this regard, a processor (e.g., a microprocessor or controller device) receives instructions from a memory or like storage device that contains and/or stores the instructions, and the processor executes those instructions, thereby performing a process defined by those instructions. Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, as exemplified above. The program code may execute entirely on a user's computer, partly on a user's computer, as a stand-alone software package, partly on a user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Where databases are described in the present disclosure, it will be appreciated that alternative database structures to those described, as well as other memory structures besides databases may be readily employed. The drawing figure representations and accompanying descriptions of any exemplary databases presented herein are illustrative and not restrictive arrangements for stored representations of data. Further, any exemplary entries of tables and parameter data represent example information only, and, despite any depiction of the databases as tables, other formats (including relational databases, object-based models and/or distributed databases) can be used to store, process and otherwise manipulate the data types described herein. Electronic storage can be local or remote storage, as will be understood to those skilled in the art. Appropriate encryption and other security methodologies can also be employed by the system of the present disclosure, as will be understood to one of ordinary skill in the art.

The presently disclosed subject matter may be embodied in other specific forms without departing from the spirit or essential characteristics thereof. The present embodiments are therefore to be considered in all respects as illustrative and not restrictive, the scope of the disclosure being indicated by the claims of the application rather than by the foregoing description, and all changes which come within the meaning and range of equivalency of the claims are therefore intended to be embraced therein.

The invention claimed is:

1. A system, comprising:
a processor;
a memory storing instructions that, when executed by the processor, cause the processor to perform operations comprising:
receiving raw environmental site data associated with one or more prior contamination sites, wherein the raw environmental site data comprises a contaminant type, a physiographic region and an eco-region for each of the one or more prior contaminated sites;
extracting relevant data from the received raw environmental site data
training an environmental machine learning model on the extracted relevant data to predict a spatial and cross-section probability distribution of a contaminant plume at a site of interest, wherein the site of interest is not the one or more prior contamination sites, wherein the environmental machine learning model is a geospatial kernel density estimation and produces a contamination migration forecast in three dimensions with partitioning along the dimensions of contaminant type, eco-region, and physiographic province; and
causing a display, on a screen display of a computing device, of a projection of the predicted probability distribution of the contaminant plume onto a graphical image of the site of interest, wherein the projected predicted probability distribution of the contaminant plume comprises an orientation and a curvature to match a groundwater flow path at the site of interest.

2. The system of claim 1, wherein the predicted probability distribution of the contaminant plume is represented as a plan view output and a cross-section view output, and wherein the instructions further cause the processor to present a three-dimensional representation of the predicted probability distribution of the contaminant plume to reflect the plan view output and the cross-section view output.

3. The system of claim 1, wherein training the environmental machine learning model comprises re-orienting historical plumes from the extracted relevant data.

4. The system of claim 1, wherein the geospatial kernel density estimation produces a probability estimate for the extent and dispersion of future plumes.

5. The system of claim 1, wherein the instructions further cause the processor to augment the raw environmental site data with one or more of: geologic profile data, depth to water measurements data, records of decisions, a contaminant plume map, and a transect view.

6. The system of claim 1, wherein the relevant data comprises data from sites having a contaminant type that is the same or similar to the contaminant type of the site of interest.

7. The system of claim 1, wherein the relevant data comprises data from sites having a physiographic region that is the same or similar to the physiographic region of the site of interest.

8. The system of claim 1, wherein the relevant data comprises data from sites having an eco-region that is the same or similar to the eco-region of the site of interest.

9. The system of claim 1, wherein training the environmental machine learning model comprises calculating the probability that a contaminant source of the contaminant plume is contained in a specified region.

10. The system of claim 1, further comprising:
augmenting the raw environmental site data with soil, depth, and groundwater profiles for each of the one or more prior contaminated sites;
generating a graphical image of two or more contamination plumes from the augmented data, wherein each of the graphical images comprises a plume geometry;
shifting the graphical images of the contamination plumes to a common origin and orientation; and
forecasting a downgradient distance of the contaminant plume at the site of interest.

11. A computer-implemented method for analyzing an environmental contaminant plume, comprising:

receiving, via a computing device, raw environmental site data associated with one or more prior contaminated sites, wherein the raw environmental site data comprises a contaminant type, a physiographic region and an eco-region for each of the one or more prior contaminated sites;

recording, via the computing device, geographic parameters from a site of interest, wherein the site of interest is not the one or more prior contamination sites;

extracting, via the computing device, relevant data from the received raw environmental site data;

training, via the computing device, an environmental machine learning model on the extracted relevant data to predict a spatial and cross-section probability distribution of the contaminant plume at the site of interest, wherein the environmental machine learning model is a geospatial kernel density estimation and produces a contamination migration forecast in three dimensions with partitioning along the dimensions of contaminant type, eco-region, and physiographic province; and causing a display, on a screen display of the computing device or a screen display of an additional computing device, of a projection of the predicted distribution of the contaminant plume onto a graphical image of the site of interest.

12. The method of claim 11, wherein the predicted distribution comprises a determination of a source of a known contaminant destination.

13. The method of claim 11, wherein the predicted distribution comprises a determination of a destination of a known contaminant source.

14. The method of claim 11, wherein the raw environmental site data comprises geographic coordinates of one or more contamination plumes of the one or more prior contaminated sites, and wherein training the machine learning model comprises translating the geographic coordinates of the one or more contamination plumes to a common contaminant origin.

15. The method of claim 14, wherein training the machine learning model further comprises rotating the one or more contamination plumes to a common orientation.

* * * * *